(12) United States Patent
Kim et al.

(10) Patent No.: US 7,740,771 B2
(45) Date of Patent: Jun. 22, 2010

(54) METHODS OF DETERMINING A COMPOSITION RATIO OF AN ORGANIC WHITE-LIGHT-EMITTING BLEND MATERIAL

(75) Inventors: Young-Chul Kim, Songpa-gu (KR); Hyun-Nam Cho, Seoul (KR); Tae-Woo Lee, Gangseo-gu (KR); O-Ok Park, Yoosung-Gu (KR); Jai-Kyeong Kim, Mapo-Gu (KR); Jae-Woong Yu, Seocho-gu (KR)

(73) Assignee: Korea Institute of Science and Technology, Seoul (KR)

( * ) Notice: Subject to any disclaimer, the term of this patent is extended or adjusted under 35 U.S.C. 154(b) by 30 days.

(21) Appl. No.: 11/559,191

(22) Filed: Nov. 13, 2006

(65) Prior Publication Data

US 2007/0069178 A1    Mar. 29, 2007

Related U.S. Application Data

(63) Continuation of application No. 10/635,591, filed on Aug. 5, 2003, now abandoned.

(30) Foreign Application Priority Data

Aug. 17, 2002   (KR) ............................... 2002-48739

(51) Int. Cl.
    *C09K 11/06*    (2006.01)
(52) U.S. Cl. .................... 252/301.16; 428/917; 428/690
(58) Field of Classification Search ............ 252/301.16; 428/690, 917
    See application file for complete search history.

(56) References Cited

U.S. PATENT DOCUMENTS 5,281,489 A    1/1994  Mori et al.
5,283,132 A    2/1994  Ogura et al.
5,683,823 A    11/1997 Shi et al.

(Continued)

FOREIGN PATENT DOCUMENTS

JP          9063770        7/1997

(Continued)

OTHER PUBLICATIONS

R.S. Deshpande et al., "White-light-emitting organic electroluminescent devices based on interlayer sequential energy transfer", Applied Physics Letters, vol. 75, No. 7, Aug. 1999, pp. 888-890.

(Continued)

*Primary Examiner*—C. Melissa Koslow
(74) *Attorney, Agent, or Firm*—Fish & Richardson P.C.

(57) ABSTRACT

Organic white-light-emitting blend materials were prepared by light-doping method and electroluminescent devices fabricated using the same, including a transparent substance, translucent electrode, white-light-emitting layer and metal electrode in order, can efficiently control Förster energy transfer in organic light-emitting materials by performing light doping, thus to fabricate a white electroluminescent device using the blend materials which can emit white-light with high efficiency. The white-light-emitting blend materials can be obtained by the light-doping method, in which the energy transfer occurs only between a host which is a donor and each dopant which is an acceptor, while the energy transfers between dopants are efficiently blocked.

4 Claims, 8 Drawing Sheets

U.S. PATENT DOCUMENTS 6,127,693 A    10/2000   Chen et al.
6,194,119 B1    2/2001   Wolk et al.

FOREIGN PATENT DOCUMENTS

JP    2000-243565    9/2000

OTHER PUBLICATIONS

Magnus Granstrom, et al., "White light emission from a polymer blend light emitting diode", Appl. Phys. Lett, 68(2), Jan. 1996, pp. 147-149.

J. Kido et al., Single-layer white light-emitting organic electroluminescent devices based on dye-dispersed poly(N-vinylcarbazole), Appl. Phys. Lett. 67(16), Oct. 1995, pp. 2281-2283.

Junji Kido, et al., "Multilayer White Light-Emitting Organic Electoluminescent Device", Science vol. 267, Mar. 1995, pp. 1332-1334.

Zhiyuan Xie, et al., "Organic multiple-quantum well white electroluminescent devices", Synthetic Metals, 106 (1999) 71-74.

Th. Forster, "Transfer Mechanisms of Electronic Excitation", Faraday Discuss. Chem. Socc. vol. 27, No. 7 (1969).

Young Chul Kim, et al., "Low-Threshold Amplified Spontaneous Emission in a Fluorene-Based Liquid Crystalline Polymer Blend", Advanced materials, vol. 13, No. 9, May 2001, pp. 646-649.

JPO abstract and computer-generated translation for JP 2000-243565, publication date Sep. 8, 2000.

Article: Organic Electroluminescence Materials and Displays; Supervisor: Junji Kido; Title page and 254-257, 400; 2001.

METHODS OF DETERMINING A COMPOSITION RATIO OF AN ORGANIC WHITE-LIGHT-EMITTING BLEND MATERIAL

This application is a continuation application of U.S. patent Ser. No. 10/635,591 filed Aug. 5, 2003, (Now abandoned) herein incorporated by reference in its entirety.

BACKGROUND OF THE INVENTION

1. Field of the Invention

The present invention relates to organic materials for white-light-emitting and an organic electroluminescent device including a light-emitting layer made of the materials. The organic/polymer white-emitting devices are easy to form a film from a solution by spin casting and emit light under electric field. Thus, the device fabricated by using the materials can be applied to the back light of liquid crystal displays, lighting devices, or color flat panel displays.

2. Description of the Background Art

A white electroluminescent device using low molecular weight materials or polymer materials has been fabricated by mainly two methods. First, there is a method of manufacturing a multilayered device composed of a number of materials which emit lights of R, G and B colors, as carried out by Kido et al. [J. Kido, M. Kimura, K. Nagai, Science, 267, p 1332 (1995)], Xie et al. [Z. Y. Xie, Y. Liu, J. S. Huang, Y. Wang, C. N. Li, S. Y. Liu, J. C. Chen, Synth. Met. 106, p 71 (1999)], Ogura et al. [T. Ogura, T. Yamashita, M. Yoshida, K. Emoto, S. Nakajima, U.S. Pat. No. 5,283,132], and Deshpande et al. [R. S. Deshpande, V. Bulovic, S. R. Forrest, Appl. Phys. Lett. 75, p 888 (1999)]. In this method, it is difficult to form a multi-layered thin film and a white-emission can be obtained by trial and error to determine the thickness of each layer. In addition, disadvantageously the emission color may change depending on the applied voltage.

The other method is doping or blending organic luminescence colorant in luminescent host substances, as carried out by Granström et al. [M. Granström, O. Inganäs, Appl. Phys. Lett. 68, p 147. (1996)], Kido et al. [J. Kido, H. Shionoya, K. Nagai, Appl. Phys. Lett. 67, 2281 (1995)], Shi et al. [J. Shi, C. W. Tang, U.S. Pat. No. 5,683,823], and Chen et al. [S.-A. Chen, E.-C. Chang, K.-R. Chuang, U.S. Pat. No. 6,127,693]. Although the process in this method is simpler than the first method, a white-emission can be obtained by repeating trial and errors without a governing principle. Particularly, when blending or doping components have excellent miscibility between them, due to energy transfer from high-bandgap components to low-bandgap components, the spectrum of the host material may be largely varied depending on blending or doping level. Thus, it is difficult to predict the final emission spectrum. Particularly, when three or more components are blended to prepare a white-light-emitting material, it is more difficult to control energy transfer between the components. Successful white-light-emission depends on how energy transfer between the components to be blended is efficiently controlled.

SUMMARY OF THE INVENTION

Therefore, an object of the present invention is to efficiently control energy transfer among blending or doping components including the main component (host) by restraining energy transfer among the accessory components (guests), and thereby to provide organic white-light-emitting materials with excellent stability and light-emitting efficiency.

Also, another object of the present invention is to provide an electroluminescent device fabricated using such organic white-light-emitting materials.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Figure 1:
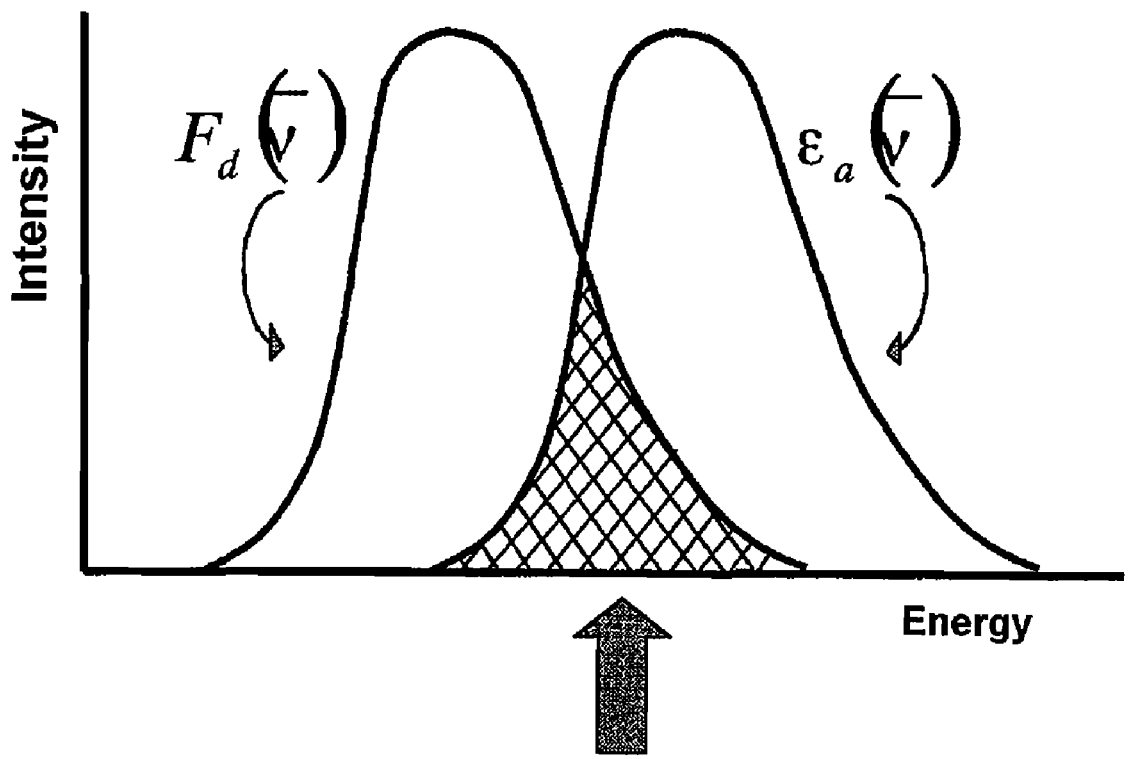
FIG. 1 is a graph showing conditions of absorbance and photoluminescence spectrum required for Förster-type energy transfer.

Reference will now be made in detail to the preferred embodiments of the present invention, examples of which are illustrated in the accompanying drawings.

The present invention uses one luminescent host material having the highest bandgap energy and 2 or more kinds of luminescent dopants (that is, three or more kinds of components) to provide a new standard for white-light-emission by efficiently controlling the energy transfer among luminescent dopants.

In the present invention, energy transfer among dopants in blend materials containing various dopants is controlled so as to transfer energy only from the host material to respective dopants. To control the energy transfer, the inventors have developed a light-doping method where the dopants are lightly embedded in the host material in amount of 0.1 wt % and below of the total weight.

The organic white-light-emitting materials of the present invention may be used as substances for the luminescent layer of electroluminescent devices. Moreover, using the luminescent layer made of the materials, a highly efficient white-light-emitting device with a wide range of emission spectrum from Blue to Red may be fabricated.

In one embodiment, the organic light-emitting material components are light-emitting conjugated polymers, light-emitting non-conjugated polymers, organic low-molecular weight light-emitting materials, copolymers of the above materials, or a derivative of the above materials.

Luminescent polymer which can be used for white-light-emitting blend materials in the present invention can be selected from the groups consisting of light-emitting conjugate polymers including polyfluorene and its derivatives, poly (p-phenylenevinylene) and its derivatives, polythiophene and its derivatives, poly(p-phenylene) and its derivatives, polyquinoline and its derivatives, polypyrrole and its derivatives, and polyacetylene and its derivatives; light-emitting non-conjugate polymers including poly(9-vinylcarbarzole) and its derivative, etc.; and organic light-emitting low-molecular materials including metal chelate complexes of ligand structure, rubrene, anthracene, perylene, coumarin 6, Nile red, aromatic diamine, TPD(N,N'-diphenyl-N,N'-bis-(3-methylphenyl)-1,1'-biphenyl-4,4'-diamine), TAZ (3-(4-biphenyl)-4-phenyl-(4-tert-butylphenyl)1,2,4-triazole), DCM (dicyanomethylene)-2-methyl-6-(p-dimethylaminostyryl)-4H-pyran) and derivatives of all of the above materials.

The theoretical basis of the present invention is 'Förster energy transfer'. This energy transfer means a long-distance excitation energy transfer between a donor and a receptor when the distance therebetween is several times larger than the sum of the van der Waals's radius. The rate of energy transfer ($k_T$) by the dipole-dipole interaction between a pair of an isolated donor and a receptor was expressed by Förster as the following formula with a parameter that can be experimentally obtained [T. Förster, Discuss. Faraday Soc. 7, p 27 (1959)].

$$k_T = \frac{9000(\ln 10)\kappa^2 \phi_d}{128\pi^5 n^4 N R^6 \tau_d} \int_0^\infty F_D(v)\varepsilon_A(v)\frac{dv}{v^4}$$

Here, "$\kappa^2$" designates the relative direction in a transition dipole space between the donor and the acceptor. "$\Phi_d$" designates a quantum efficiency of the donor under the condition that there is no acceptor. "n" designates a refractive index of the medium between the donor and the acceptor. "N" is Avogadro's number, and "R" is the distance between the centers of the donor and the acceptor. "$\tau_d$" designates an intrinsic lifetime of the donor under the condition that there is no acceptor. "$F_D(v)$" designates the normalized spectrum distribution of donor emission, and "$\varepsilon_A(v)$" is the extinction coefficient per mole (1 mol$^{-1}$cm$^{-1}$) of the acceptor which is expressed as a function of wavelenth v. Efficient energy transfer can occur only when the emission spectrum of the donor and the absorption spectrum of the acceptor overlap with each other (FIG. 1).

The present invention lays emphasis on increasing the distances (R) among two or more dopants. As the distances are increased, energy transfer hardly occurs among the dopants, and thus the energy transfer occurs only between the host and the respective dopants. In the above case, a desired color is obtained by just considering energy transfer between the host and the respective dopants, and there is no affection by the energy transfer among the dopants even when the respective dopants are mixed together in a host material. Therefore, by coordinating the colors obtained through energy transfer between a host and each dopant, the white-light-emission spectrum can be designed.

A ternary blend system composed of A, B and C will be, for instance, described. When A is the largest bandgap material, B is the second large, and C is the smallest, A (polymer) is used as the host (energy donor), and B and C (polymer or low-molecular weight organic material) can receive energy from the donor A. That is, the absorption spectra of B and C overlap with the photoluminescence spectrum of A. Since the photoluminescence spectrum of B and the absorption spectrum of C overlap with each other, many routes of energy transfer, such as A→B→C, A→B, A→C, or B→C, may exist, and thus it is not easy to control the energy transfer to occur only between the host and the dopants. Therefore, in the conventional method of trial and error, it is very difficult to determine the composition of white-light-emitting blend material and much harder to control energy transfer for obtaining a desired color from a blend with four or more components.

Figure 2:
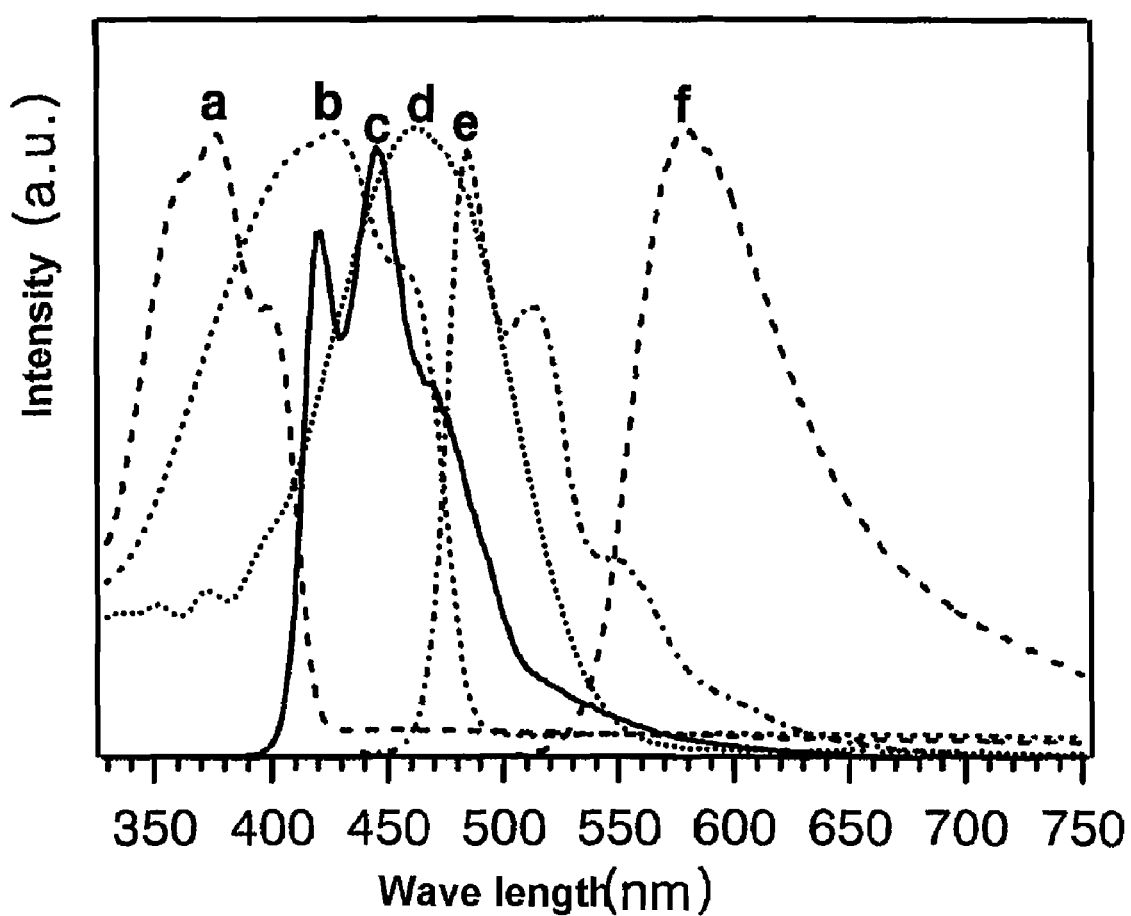
FIG. 2 shows the absorption and photoluminescence spectra of poly(2,7-bis(p-stiryl)-9,9'-di-n-hexylfluorene sebacate) (PBSDHFS), poly(9,9'-di-n-hexylfluorenediylvinylene-alt-1,4-phenylenevinylene) (PDHFPPV), and 4-(dicyanomethylene)-2-methyl-6-(p-dimethylaminostyryl)-4H-pyran (DCM)

A typical case of the ternary system is shown in FIG. 2. FIG. 2 shows the absorption and photoluminescence spectra of poly(2,7-bis(p-stiryl)-9,9'-di-n-hexylfluorene sebacate) (PBSDHFS) (Reference: Y. C. Kim, T.-W. Lee, O O. Park, C. Y. Kim, H. N. Cho, Advanced Materials, 13, p 646 (2001)), poly(9,9'-di-n-hexyl fluorenediylvinylene-alt-1,4-phenylenevinylene) (PDHFPPV) (Reference: Y. C. Kim, T.-W. Lee, O O. Park, C. Y. Kim, H. N. Cho, Advanced Materials, 13, p 646(2001)), and 4-(dicyanomethylene)-2-methyl-6-(p-dimethylaminostyryl)-4H-pyran (DCM).

Judging from the absorption and emission bands of these materials, PBSDHFS corresponds to the substance A, PDHFPPV corresponds to the Substance B, and DCM corresponds to the substance C. In the above drawing, "a" designates the absorption spectrum of PBSDHFS, "b" designates the absorption spectrum of PDHFPPV, "c" designates the photoluminescence spectrum of PBSDHFS, "d" designates the absorption spectrum of DCM, "e" designates the photoluminescence spectrum of PDHFPPV, and "f" designates the photoluminescence spectrum of DCM.

The feature of the present invention is to restrain the energy transfer between the dopants B and C by lightly incorporating B and C in a small amount of 0.1 wt % or below. Since the amounts of the dopants B and C are very small, a distance R between the two dopants becomes larger, and accordingly, energy transfer between the dopants can hardly occur. Therefore, the respective dopant components receive the energy transfer only from the host. Therefore, in the above case, the energy transfer of A→B and A→C is to be considered. By such light-doping method, efficient control of the energy transfer mechanism in polymer blends of 3 or more components can be achieved.

The amount of a dopant varies depending on the substance used, preferably 0.1 wt % or below. For some substances used for dopants, incorporation of extremely small amount just over 0 or about 10$^{-5}$ wt % of the blend can achieve the object of the present invention.

Figure 3:
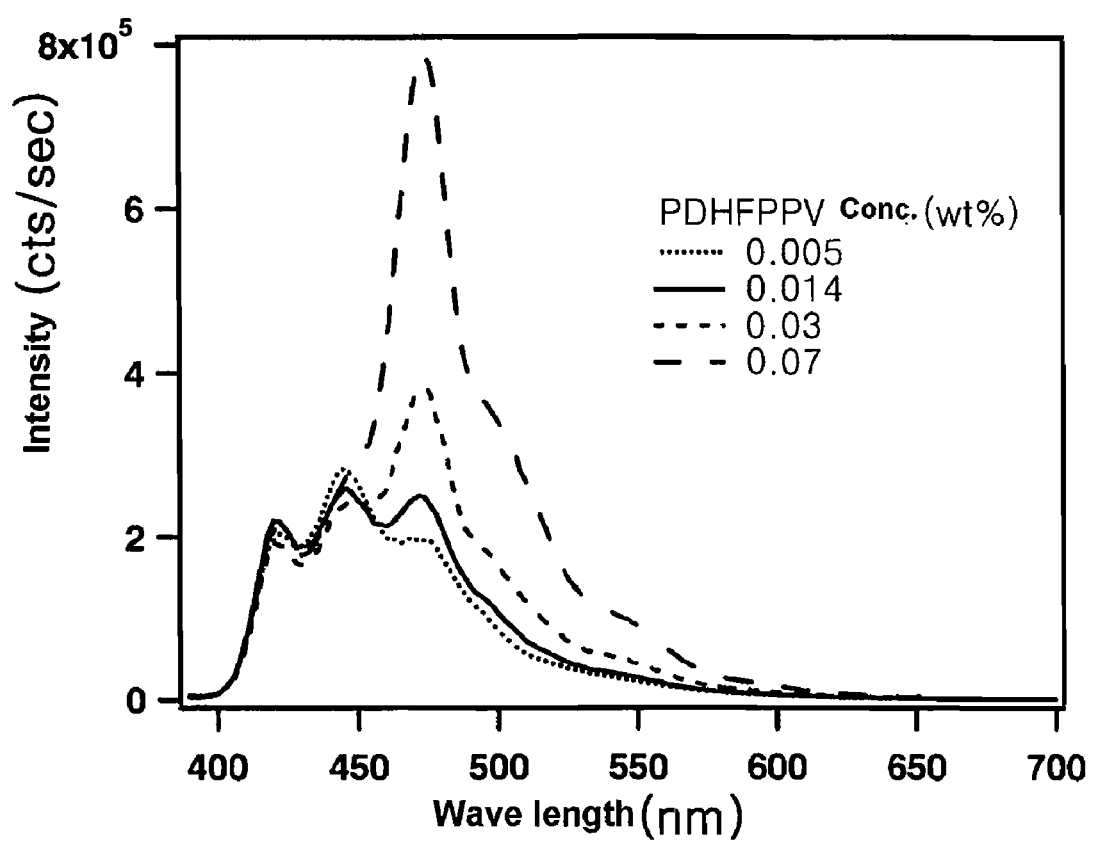
FIG. 3 shows the photoluminescence spectra of the PBSDHFS/PDHFPPV binary blends with different PDHFPPV concentrations.

With the three materials mentioned above, the present invention will be described in more detail. FIG. 3 shows how the emission spectrum of the binary blend of A and B is changed by the energy transfer with increasing concentration of the dopant B. Since A is a liquid crystalline light-emitting substance and B is also a similar fluorene-based substance, the blend of A and B in which B is added in a very small amount also has a liquid crystalline property. Therefore, the factor of $\kappa^2$ for the blend of A and B is larger than that of the polymer blend having random dipole directions, and accordingly, energy transfer can efficiently occur. In FIG. 3, when B is added in a very low concentration, such as about 0.014 wt %, the emissions of A and B almost equally contribute to the overall spectrum of the binary blend. Accordingly, the composition ratio at which A and B show comparable luminescent intensities can be determined.

Figure 4:
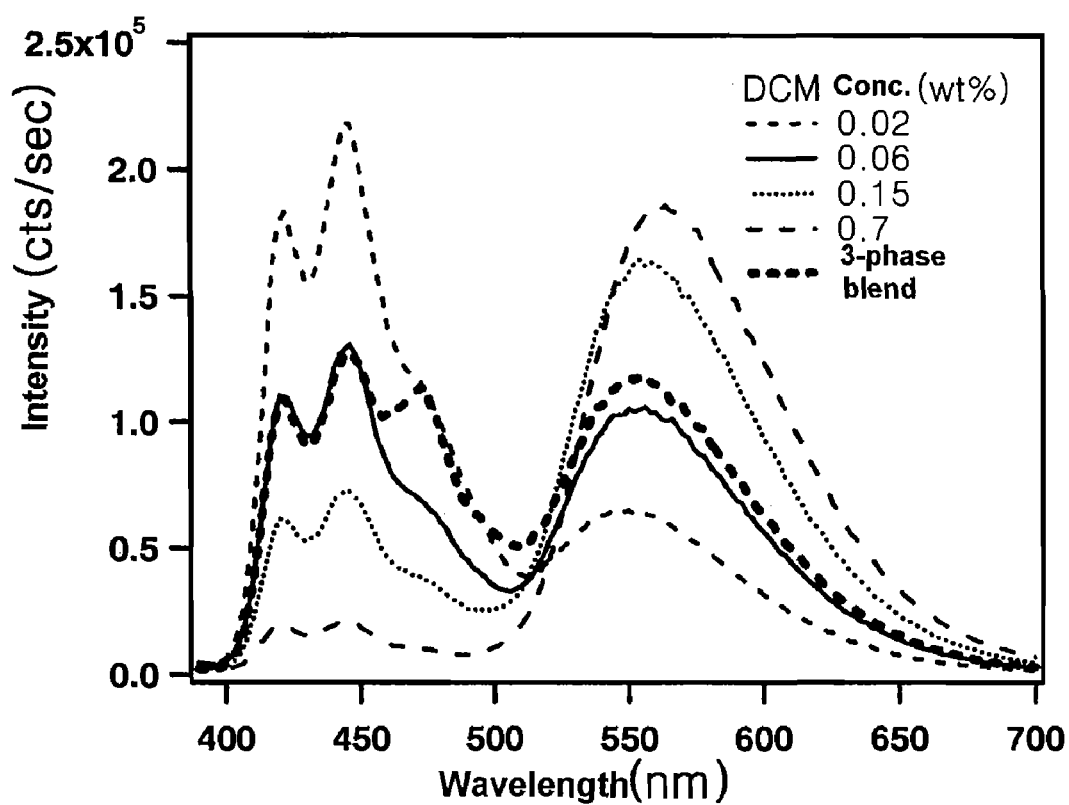
FIG. 4 shows the photoluminescence spectra of the PBSDHFS/DCM binary blends with different DCM concentrations.

FIG. 4 shows the spectral change of the binary blend of A and C with increasing concentration of the dopant C. Also, it can be proved that practically equal luminescence is emitted from A and C when C is added to A in a very low concentration, such as 0.06 wt %.

Therefore, when 0.014 wt % of B and 0.06 wt % of C are added to A, as shown in the ternary blend of FIG. 4, the substances A, B, and C contribute almost equally to the photoluminescence spectrum of the ternary blend in luminescent intensity but at different wavelength regions, thus the blend show white-light-emission.

The above method can be also used for the polymer blends of 4 or more components to obtain white-light-emission. The fourth component employed is alumina quinone (Alq3) which emits green light with the peak wavelength of 500 nm. By analyzing the spectral change of the A/Alq3 binary blend with varying composition of Alq3, the optimum amount of Alq3 in the blend was determined to be 0.04 wt %. Finally, when 0.04 wt % of Alq3 is added to the blend of A, B and C mixed in the above determined amounts, white-light-emission can be also obtained.

The amount of dopants added in white-light-emitting blend materials, which can be determined by the above method, depends on the characteristics of each substance used, but it is clear that each dopant is added in a very small amount such as 0.1 wt % or lower. This is one feature of the present invention distinguished from other methods which attempt to achieve white-light-emission by using polymer as the host.

In summary, the present invention provides an easy and convenient method for obtaining white-light-emission by efficiently blocking energy transfer among dopants in the multi-component, electroluminescent blend comprising polymer as the host. Wherein, as the method for controlling such energy transfer, the light-doping method is used.

Figure 5:
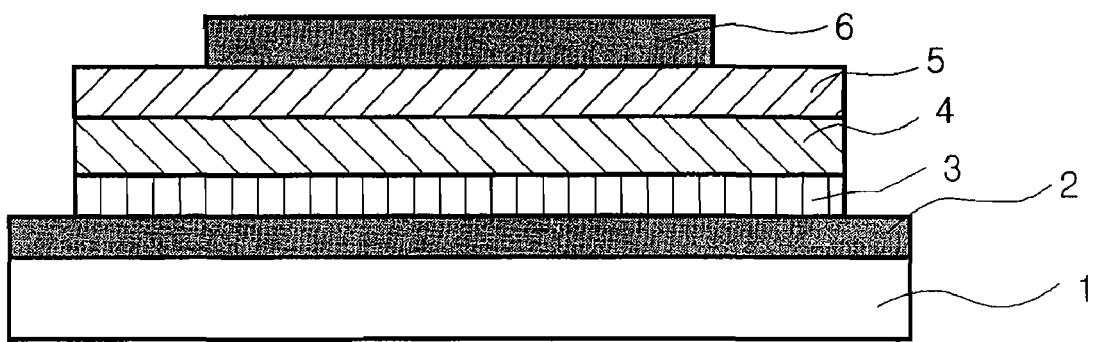
FIG. 5 is a cross-sectional view showing an electroluminescent device in accordance with the present invention.

The present invention provides an organic and/or polymer white-electroluminescent device containing a luminescent layer which is formed from the blend materials. As shown in FIG. 5, in the electroluminescent device containing the organic white-light-emitting materials in accordance with the present invention, an organic white-light-emitting layer(4) which is spin-cast from the blend solution of the present invention is formed on a transparent substrate(1) such as a glass plate and the like on which a translucent electrode(2) is formed. A metal cathode(6) is formed on the luminescent layer. In order to improve the light-emitting efficiency, a hole transporting layer(3) may be placed between the translucent electrode(2) and the white-light-emitting layer(4) or an electron transporting layer(5) between the white-light-emitting layer(4) and the metal cathode(6).

As the transparent substrate, glass, quartz, or PET(polyethylene terephtalate) film which is a transparent plastic material is used, and as the translucent electrode, ITO(indium tine oxide), PEDOT(polyethylene dioxythiophene), or polyaniline can be used. The cathode metal may be selected from the group consisting of aluminum, magnesium, lithium, calcium, copper, silver, gold, and an alloy of the above materials.

It is desirable that the hole transporting layer is made of poly(9-vinylcarbazol) or polymer derivatives containing 4,4'-dicarbazolyl-1,1'-biphenyl (CBP), TPD(N,N'-diphenyl-N, N'-bis-(3-methylphenyl)-1,1'-biphenyl-4,4'-diamine), or NPB(4,4'-bis[N-(1-naphthyl-1-)-N-phenyl-amino]-biphe- nyl) moiety; low-molecular derivatives containing triarylamine or pyrazoline moiety; or organic molecules containing hole transporting moiety. The electron transporting layer is desirable to be made of TPBI [2,2',2'-(1,3,5-phenylene)-tris (1-phenyl-1H-benzimidazole)], poly(phenyl quinoxaline), 1,3,5-tris[(6,7-dimethyl-3-phenyl)quinoxaline-2-yl]benzene (Me-TPQ), polyquinoline, tris(8-hydroxy quinoline) aluminum(Alq3), [6-N,N-diethylamino-1-methyl-3-phenyl-1H-pyrazolo(3,4-b) quinoline](PAQ-NEt2), or organic molecules containing electron transporting moiety.

The light-emitting efficiency of the electroluminescent device is indicated as external quantum efficiency, which is expressed by the percentage (%) of the emitted photons to the injected electrons.

Hereinafter, the present invention will be described in more detail with the following examples. These examples are given only to illustrate the present invention, not to limit the scope of it.

Example 1

Preparation of a White-light-emitting Material Containing 3 Components and Identification of the Photoluminescence Spectrum I PBSDHFS which is a liquid crystalline, fluorene-based light-emitting substance was used as a light-emitting host and donor of energy transfer. PDHFPPV which is also a fluorene-based light-emitting substance and DCM which is a low molecular weight dye substance were used as the dopants. Upon changing the concentration of PDHFPPV in PBSDHFS, the photoluminescence intensity contribution of each component in the binary blend became almost similar at the PDHFPPV concentration of 0.014 wt %. Also, when DCM was used in PBSDHFS as the dopant, the photoluminescence intensity contribution of each component in the binary blend was similar at the DCM concentration of 0.06 wt %. Finally, white photoluminescence of the 1932 CIE color coordinate (0.29, 0.32) was obtained by doping PBSDHFS with 0.014 wt % of PDHFPPV and 0.06 wt % of DCM to fabricate a film and performing optical excitation with 370 nm monochromatic light.

Example 2

Preparation of a White-light-emitting Material Containing 3 Components and Identification of the Photoluminescence Spectrum II PBSDHFS which is a liquid crystalline, fluorene-based light-emitting substance was used as a light-emitting host and donor of energy transfer. Poly(9,9'-dihexylfluorene-2,7-divinylene-m-phenylenevinylene-stat-p-phenyleneviny-lene) (CPDHFPV) which is also a fluorene-based light-emitting substance and DCM which is a low molecular dye substance were used as the dopants. Upon changing the concentration of CPDHFPV in PBSDHFS, the photoluminescence intensity contribution of each component in the binary blend became almost similar at the CPDHFPV concentration of 0.015 wt %. Also, when DCM was used in PBSDHFS as the dopant, the photoluminescence intensity contribution of each component in the binary blend was similar at the DCM concentration of 0.06 wt %. Finally, white photoluminescence was obtained by doping PBSDHFS with 0.015 wt % of CPDHFPV and 0.06 wt % of DCM to fabricate a film and performing optical excitation with 370 nm monochromatic light.

Example 3

Fabrication I of an Electroluminescent Device Fabricated Using a White-light-emitting Material Containing 3 Components

A light-emitting polymer blend material was prepared by doping PBSDHFS with 0.014 wt % of PDHFPPV and 0.06 wt % of DCM, using chlorobenzene as a casting solvent. Then, an electroluminescent device was fabricated by spin-casting the blend material on an ITO-coated glass substrate to form a thin film of 65 nm thickness and then depositing an aluminum electrode at a high vacuum of $2\times10^{-5}$ torr with a thermal evaporator.

Comparison Example

Fabrication of a Luminescent Device Fabricated Using a Single Substance of PBSDHFS as the Luminescent Layer

An electroluminescent device was fabricated by spin-casting PBSDHFS on an ITO-coated glass substrate to form a thin film of 65 nm thickness using chlorobenzene as the solvent and then depositing an aluminum electrode at a high vacuum of $2\times10^{-5}$ torr with a thermal evaporator.

Example 4

Analysis of the Electroluminescence Spectra of a Device Fabricated Using a White-light-emitting Material Containing 3 Components

Figure 6:
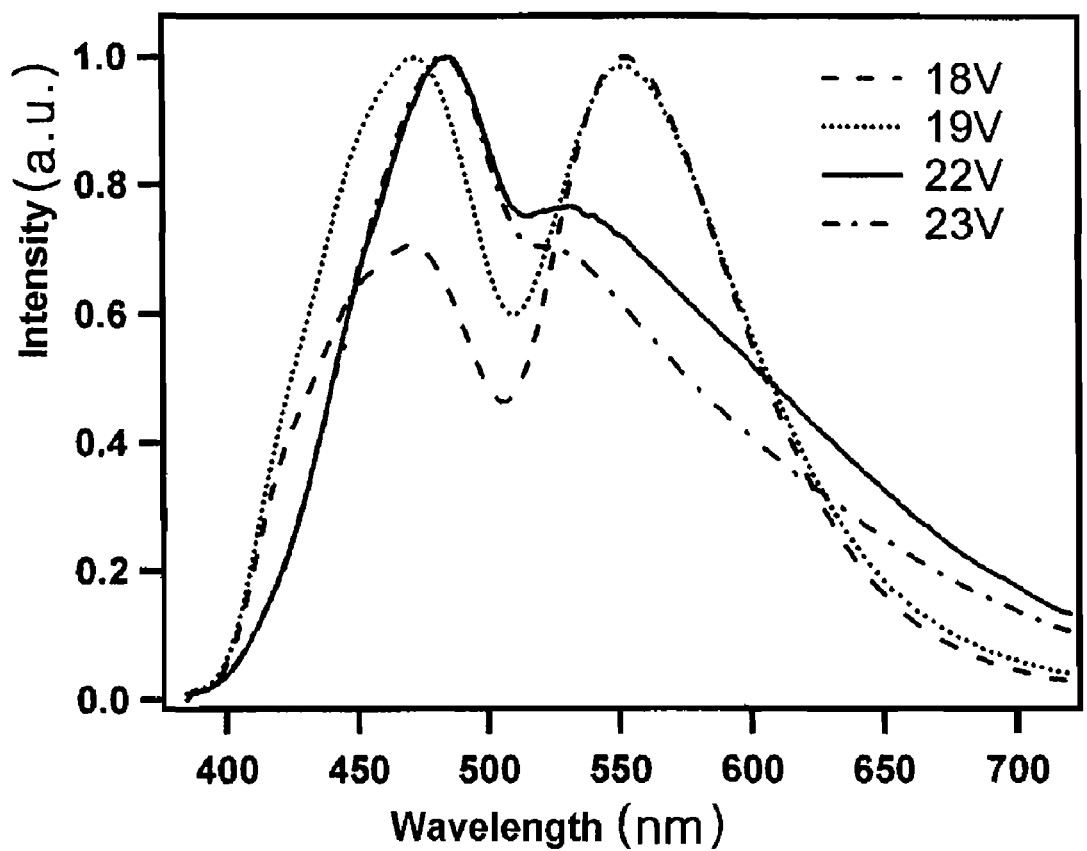
FIG. 6 shows the electroluminescence spectra of the electroluminescent device fabricated with a ternary blend of PBSDHFS/PDHFPPV(0.014 wt %)/DCM(0.06 wt %) measured under different applied voltages.
Figure 7:
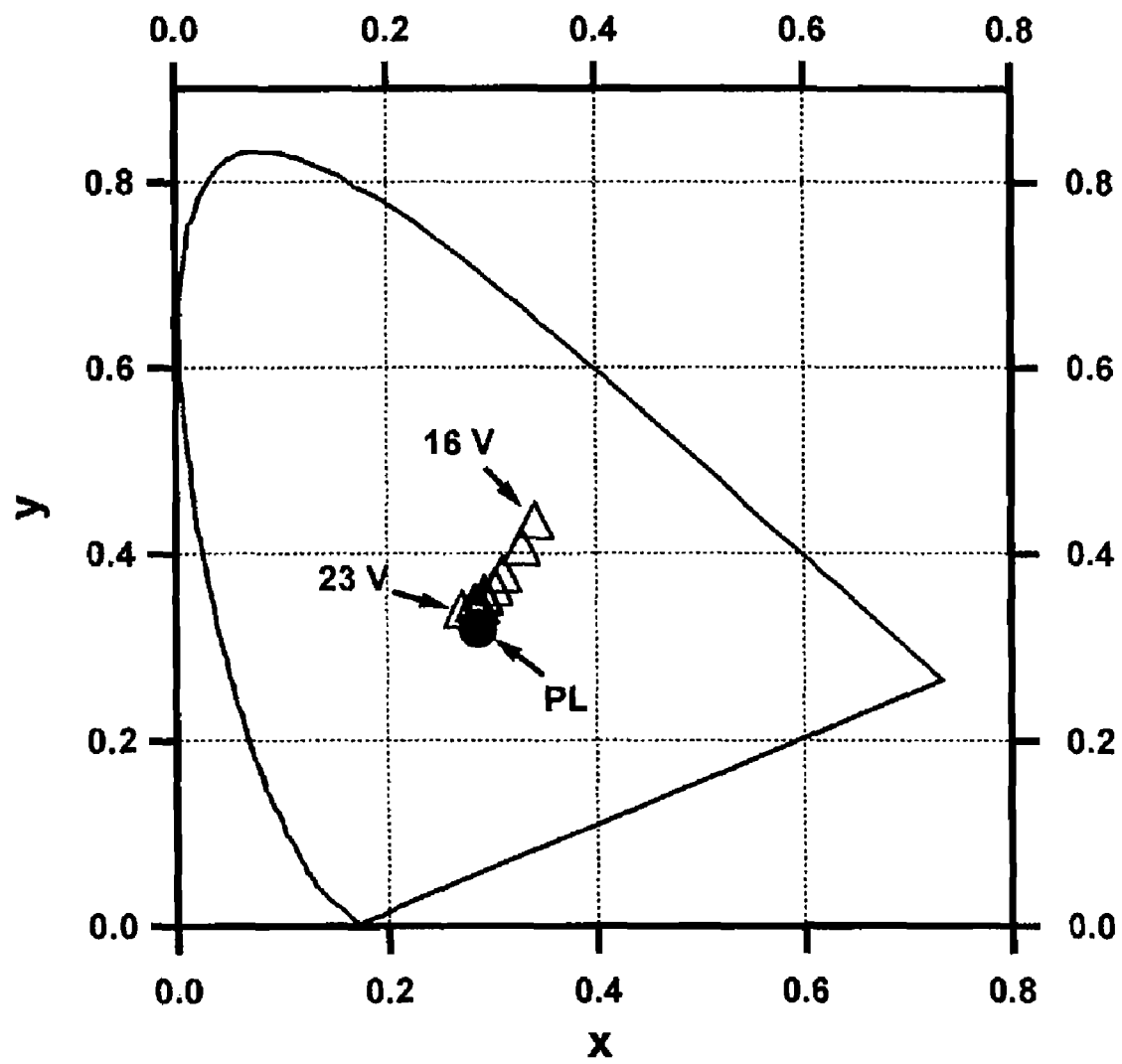
FIG. 7 shows the color coordinates of the electroluminescent device fabricated with a ternary blend of PBSDHFS/PDHFPPV(0.014 wt %)/DCM(0.06 wt %) measured under different applied voltages.

The electroluminescence spectra of the device which was fabricated in the same method as in Example 3 were measured with an ISS PC1 photon counting spectrofluorometer and Keithley 236 Source Measurement Unit which simultaneously measures the current, the applying voltage, and the luminance. As shown in FIG. 6, all light-emissions showed white color at the applied voltages between 18 and 23 V. It was confirmed that all the emission color coordinates were included in the white-light-emitting region on the 1932 CIE chart as shown in FIG. 7.

Example 5

Test of Light-emitting Characteristics of an Electroluminescent Device Fabricated Using a White-light-emitting Material Containing 3 Components

The current-voltage-luminance (I-V-L) characteristics of the electroluminescent device which was fabricated by the same method as in Example 3 were measured by using an optical powermeter (Newport 1830-C), a photo diode (Newport 818-UV), and Keithley 236 Source Measurement Unit which simultaneously measures currents and voltages. Accordingly, a quantum efficiency value was computed from the obtained results.

Figure 8:
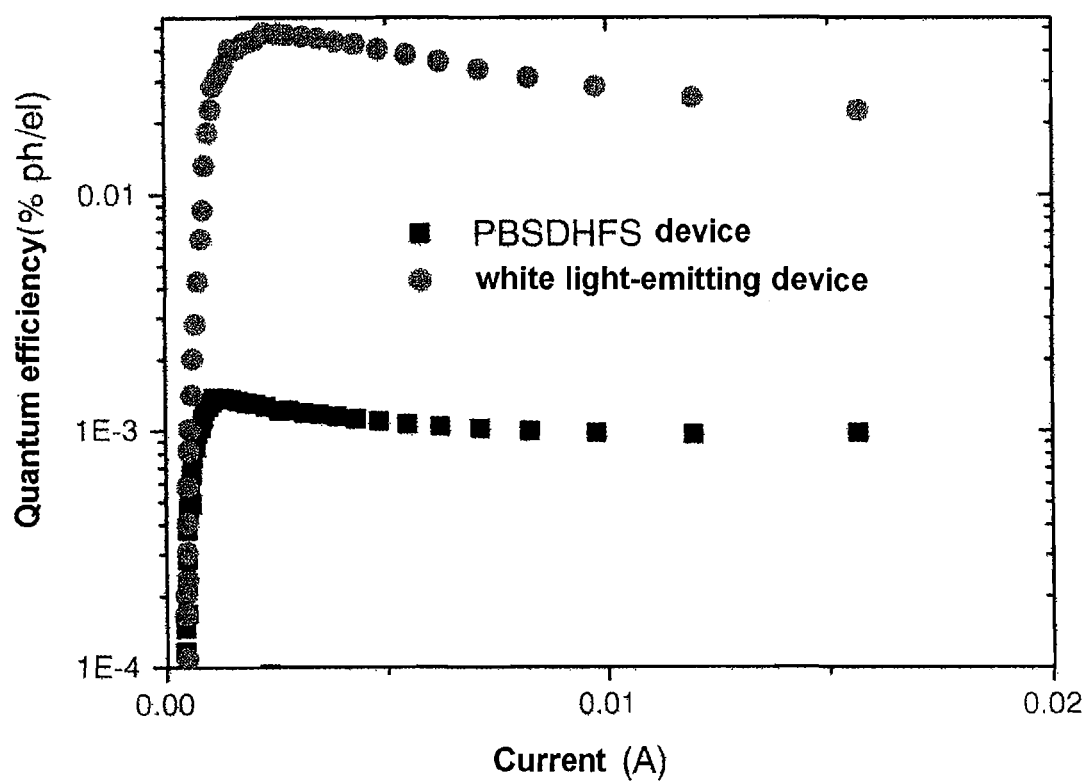
FIG. 8 is a graph showing the quantum efficiency of the devices fabricated by the methods described in example 3 and in a comparison example measured as a function current.

FIG. 8 is a graph showing the quantum efficiency of the devices fabricated by the methods described in Example 3 (●) and in a comparison example (■) measured as a function current. As shown in FIG. 8, such quantum efficiency as 0.047% (ph/el) is a relatively large value for a single layer device. It was disclosed that there was a substantial increase in the luminescent efficiency of the electroluminescent device in Example 3 in comparison with that of the electroluminescent device composed of PBSDHFS which was manufactured by the method of the comparison example.

Example 6

Fabrication II of an Electroluminescent Device Using a White-light-emitting Material Containing 3 Components

The electroluminescent device was fabricated by the same method in Example 3, except for doping the host, PBSDHFS, with 0.05 wt % of Alq3, and 0.06 wt % of DCM, spin-casting the blend to have a thickness of 120 nm, and depositing thereon an Ag-electrode after depositing a Ca-electrode.

Example 7

Fabrication I of an Electroluminescent Device Using a White-light-emitting Material Containing 4 Components

The electroluminescent device was fabricated by the same method in Example 3, except for doping the host, poly(9-vinylcarbazole), with 0.03 wt % of CPDHFPV, 0.05 wt % of Alq3, and 0.06 wt % of DCM, spin-casting the blend to have a thickness of 120 nm, and depositing thereon a Mg layer as an electrode.

Example 8

Fabrication II of an Electroluminescent Device Using a White-light-emitting Material Containing 4 Components

The electroluminescent device was fabricated by the same method in Example 3, except for doping the host, PBSDHFS, with 0.014 wt % of PDHFPPV, 0.05 wt % of Alq3, and 0.06 wt % of DCM, spin-casting the blend to have a thickness of 100 nm, and depositing thereon an Al-electrode after heat-depositing a 1 nm-thick LiF layer.

Example 9

Fabrication III of an Electroluminescent Device Using a White-light Emitting Material Containing 4 Components

The electroluminescent device was fabricated by the same method in Example 3, except for doping the host, PBSDHFS, with 0.02 wt % of CPDHFPV, 0.05 wt % of Alq3, and 0.03 wt % of MEH-PPV (poly[2-methoxy-5-(2'-ethyl-hexyloxy)-1,4-phenylenevinylene]), spin-casting the blend to have a thickness of 100 nm, and depositing thereon an Al-electrode after heat-depositing a 1 nm-thick LiF layer.

As described above, the present invention provides organic light-emitting blend materials which emit white light with high efficiency by mixing three or more components of organic light-emitting materials and the electroluminescent device fabricated using the blend materials. The electroluminescent device of the present invention includes a substrate having a transparent substrate and a translucent electrode thereon, an organic white-emitting layer which is formed with a blend of 3 or more kinds of luminescent components including 2 or more kinds of dopants added in 0.1 wt % or lower concentrations on the translucent electrode, and a metal electrode which is deposited on the white-emitting layer. Since the electroluminescent device of the present invention can stably emit white light, and the light-emitting efficiency is excellent, it can be widely employed to develop flat panel and plastic displays.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalence of such metes and bounds are therefore intended to be embraced by the appended claims.

What is claimed is:

1. A method of determining a composition ratio of an organic white light-emitting blend material which comprises three electroluminescent organic light-emitting material components which are each independently light-emitting conjugated polymers, light-emitting non-conjugated polymers, organic low-molecular weight light-emitting materials, copolymers of the above materials, or a derivative of the above materials, comprising the steps of:

(a) defining the electroluminescent organic light-emitting material component having the highest bandgap energy as a host component and defining the other electroluminescent organic light-emitting material components as at least a first dopant and a second dopant;

(b) generating a plurality of binary blends comprising the host component and the first dopant wherein each of the binary blends has a different concentration of the first dopant and where the first dopant is present in an amount of 0.1 wt % or less in each of the binary blends;

(c) determining a binary composition ratio between the host material and the first dopant wherein a luminescent intensity of the host component is comparable to that of the first dopant;

(d) generating a plurality of binary blends comprising the host component and the second dopant, wherein each of the binary blends has a different concentration of the second dopant and where the second dopant is present in an amount of 0.1 wt % or less in each of the binary blends;

(e) determining a binary composition ratio between the host material and the second dopant wherein a luminescent intensity of the host component is essentially the same as the second dopant; and (f) combining said binary composition ratios to obtain a composition ratio, wherein the first dopant and second dopant are each present in an amount of 0.1 wt % or less based on the total weight of the organic white light-emitting blend material.

2. The method of claim 1, wherein the step (c) comprises:

inspecting a host wavelength, which is the wavelength when the host component has the highest luminescent intensity, and a dopant wavelength, which is the wavelength when the first dopant has the highest luminescent intensity, selecting binary blend among the plurality of binary blends where the luminescent intensity at the host wavelength is comparable to the luminescent intensity at the dopant wavelength, and determining a concentration of the first dopant contained in the binary blend.

3. The method of claim 1, wherein the light-emitting conjugated polymers comprises poly(p-phenylenevinylene), polythiophene, poly(p-phenylene), polyfluorene, polyquinoline, polyacetylene, and polypyrrole and its derivatives; and the light-emitting non-conjugated polymers comprise poly(9-vinylcarbazole), or a derivative thereof.

4. The method of claim 1, wherein the electroluminescent organic electroluminescent material components comprise organic low-molecular light-emitting materials, wherein the organic low-molecular weight light-emitting materials comprise metal complex compounds of a ligand structure, rubrene, anthracene, perylene, coumarin 6, Nile Red, aromatic diamines, TPD(N,N'-diphenyl-N,N'-bis-(3-methylphenyl)-1,1'-biphenyl-4,4'-diamine), TAZ(3-(4-biphenyl)-4-phenyl-5-(4-tert-butylphenyl)-1,2,4-triazole), DCM (dicyanomethylene)-2-methyl-6-(p-dimethylaminostyryl)-4H-pyran), and derivatives of the above materials.

* * * * *